US007457042B2

(12) United States Patent
Omura

(10) Patent No.: US 7,457,042 B2
(45) Date of Patent: Nov. 25, 2008

(54) PROJECTION OPTICAL SYSTEM, EXPOSURE APPARATUS, AND EXPOSURE METHOD

(75) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 209 days.

(21) Appl. No.: 11/224,062

(22) Filed: Sep. 13, 2005

(65) Prior Publication Data
US 2006/0001981 A1 Jan. 5, 2006

Related U.S. Application Data

(63) Continuation-in-part of application No. PCT/JP2004/003503, filed on Mar. 16, 2004.

(30) Foreign Application Priority Data
Mar. 17, 2003 (JP) ............................. 2003-071495

(51) Int. Cl.
*G02B 9/00* (2006.01)
(52) U.S. Cl. ..................................... 359/649
(58) Field of Classification Search ......... 359/649–651, 359/730, 754; 355/67
See application file for complete search history.

(56) References Cited

U.S. PATENT DOCUMENTS

| 5,771,125 | A | 6/1998 | Ishiyama |
| 6,522,484 | B1 | 2/2003 | Schuster |
| 6,646,718 | B2 | 11/2003 | Schuster et al. |
| 6,707,616 | B1 * | 3/2004 | Takahashi et al. ........... 359/649 |
| 6,801,364 | B2 | 10/2004 | Schuster |
| 7,190,527 | B2 * | 3/2007 | Rostalski et al. ............ 359/649 |
| 7,203,007 | B2 * | 4/2007 | Schuster ...................... 359/649 |
| 2003/0007138 | A1 | 1/2003 | Shigematsu et al. |
| 2003/0030916 | A1 | 2/2003 | Suenaga |
| 2004/0233409 | A1 * | 11/2004 | Schuster et al. ............... 355/67 |

FOREIGN PATENT DOCUMENTS

| EP | 0902329 A1 | 3/1999 |
| JP | A-10-003040 | 1/1998 |
| JP | A-2000-171699 | 6/2000 |
| JP | A-2002-287023 | 10/2002 |
| JP | A-2002-544569 | 12/2002 |
| WO | WO 01/50171 A1 | 7/2001 |

* cited by examiner

*Primary Examiner*—Hung X. Dang
*Assistant Examiner*—Vipin M Patel
(74) *Attorney, Agent, or Firm*—Oliff & Berridge, PLC

(57) ABSTRACT

A projection optical system which uses, for example, an ArF excimer laser beam and can ensure a good imaging performance for an extended period while avoiding the variations in refractive index and the effect of the intrinsic double refraction of a fluorite containing a high-frequency component. A projection optical system for forming the demagnified image of a first plane (R) on a second plane (W). A first light transmitting member (L23) disposed closest to the second plane side and having almost no refraction power is provided. When the distance between the first light transmitting member and the second plane is WD, a numerical aperture on the second plane side NA, and the center wavelength of a light used L×10$^{-6}$, the condition 0.06<WDNA/L<0.23 is satisfied. Or, a first light transmitting member disposed closest to a second plane side and having almost no refraction power, and a second light transmitting member (L22) disposed adjacent to the first plane side are provided. When an air-equivalent length from the second light transmitting member to the second plane is OD, the condition 0.1<ODNA/L<0.4 is satisfied.

43 Claims, 7 Drawing Sheets

PROJECTION OPTICAL SYSTEM, EXPOSURE APPARATUS, AND EXPOSURE METHOD

RELATED APPLICATIONS

This is a Continuation-In-Part application of International Patent application Ser. No. PCT/JP2004/003503 filed on Mar. 16, 2004, now pending.

BACKGROUND OF THE INVENTION

1. Field of the Invention

The present invention relates to a projection optical system, exposure apparatus, and exposure method and, more particularly, to a projection optical system suitable for exposure apparatus used in producing such microdevices as semiconductor devices by photolithography.

2. Related Background Art

Currently, miniaturization has been promoted in production of semiconductor devices and semiconductor chip mounting substrates, and there are demands for a projection optical system with higher resolving power in the exposure apparatus for printing a pattern of a mask on a wafer as a photosensitive substrate. In order to satisfy such demands for high resolution, it is necessary to decrease the wavelength of exposure light and to increase the NA (image-side numerical aperture of the projection optical system).

However, the shorter the wavelength of the exposure light, the more limited the kinds of optical materials available for practical use because of absorption of light. In the case of the exposure apparatus using light in the ultraviolet region, for example, where the wavelength is not more than 200 nm, particularly, an ArF excimer laser beam (wavelength 193 nm) as exposure light, it is common design to make light transmitting members (e.g., lenses) in the projection optical system of silica and fluorite (calcium fluoride: $CaF_2$).

Incidentally, if a silica optical component is located at a position with a high fluence (fluence=energy amount per unit area and unit pulse) in the projection optical system using the ArF excimer laser beam, it will be likely to suffer a local refractive-index change or compaction due to volumetric shrinkage, under irradiation with the laser beam, and, in turn, the volumetric change of the silica optical component can degrade the imaging performance of the projection optical system.

In the case of the exposure apparatus, the light transmitting member located near the photosensitive substrate in the projection optical system tends to have a small clear aperture radius and, in turn, the fluence tends to be high there. Therefore, where the light transmitting member located near the photosensitive substrate is made of silica, compaction is likely to occur in this silica transmitting member. As a result, the endurance of the projection optical system will depend upon the silica transmitting member being placed near the photosensitive substrate and likely to suffer compaction. Then, there is a known technology of forming the light transmitting member placed near the photosensitive substrate, of fluorite being an optical material free of compaction.

On the other hand, fluorite is a crystal material and has intrinsic birefringence. Particularly, for example, in a case where light with the wavelength of not more than 200 nm passes through fluorite, the influence of intrinsic birefringence is significant; therefore, it is necessary to suppress degradation of the imaging performance due to the intrinsic birefringence, by a combination of a pair of fluorite transmitting members with different crystallographic orientations.

However, the degradation of the imaging performance due to the intrinsic birefringence cannot be completely suppressed even by the combination of a pair of fluorite transmitting members with different crystallographic orientations. Furthermore, it is known that an internal refractive-index distribution of fluorite has high-frequency components, and the variation of refractive index including the high-frequency components tends to cause a flare and thus to degrade the imaging performance of the projection optical system.

For example, in the case of the exposure apparatus using the ArF excimer laser beam as exposure light, degasification (outgassing) inevitably occurs from a photoresist during exposure. In the projection optical systems with relatively large numerical apertures proposed heretofore, therefore, contamination of lenses due to the degasification cannot be avoided without any particular countermeasures.

The present invention has been accomplished in view of the above problem and an object of the invention is to provide a projection optical system capable of securing good imaging performance over a long period, while avoiding the variation of refractive index including the high-frequency components and the influence of intrinsic birefringence of fluorite, for example, using the ArF excimer laser beam. Another object of the invention is to provide an exposure apparatus and exposure method capable of performing good projection exposure with high resolution, for example, using the projection optical system capable of securing good imaging performance over a long period, for example, for the ArF excimer laser beam.

SUMMARY OF THE INVENTION

In order to solve the above problem, a first aspect of the present invention is to provide a projection optical system for forming a demagnified (reduced) image of a first surface on a second surface, comprising: a first light transmitting member with substantially no refracting power placed nearest to the second surface, the projection optical system satisfying a condition of $0.06 < WD \sim NA/L < 0.23$, where WD is a distance along the optical axis between the first light transmitting member and the second surface, NA is a numerical aperture on the side of the second surface, and a center wavelength of used light is $L \times 10^{-6}$.

A second aspect of the present invention is to provide a projection optical system for forming a demagnified (reduced) image of a first surface on a second surface, comprising: a first light transmitting member with substantially no refracting power placed nearest to the second surface; and a second light transmitting member placed adjacent on the first surface side to the first light transmitting member, the projection optical system satisfying a condition of $0.1 < OD \sim NA/L < 0.4$, where OD is an air-equivalent length along the optical axis from the second light transmitting member to the second surface, NA a numerical aperture on the side of the second surface, and a center wavelength of used light is $L \times 10^{-6}$.

A third aspect of the present invention is to provide an exposure apparatus comprising: an illumination system for illuminating a mask set as the first surface; and the projection optical system of the first aspect or the second aspect for forming an image of a pattern formed on the mask, on a photosensitive substrate set as the second surface.

A fourth aspect of the present invention is to provide an exposure method comprising: an illumination step of illuminating a mask set as the first surface; and an exposure step of projecting a pattern formed on the mask, onto a photosensitive substrate set as the second surface, by means of the projection optical system of the first aspect or the second aspect.

A fifth aspect of the present invention is to provide a method of producing a micro device, comprising: a substrate preparation step of preparing a substrate coated with a photosensitive material; a mask preparation step of preparing a mask on which a predetermined circuit pattern is formed; an illumination step of setting the mask as the first surface and illuminating the mask; an exposure step of projecting the pattern formed on the mask, onto the photosensitive substrate set as the second surface, by means of the projection optical system of the first aspect or the second aspect; a development step of developing the photosensitive material on the substrate; and a pattern forming step of forming the predetermined circuit pattern on the substrate, using the photosensitive material after the development, as a mask The present invention will be more fully understood from the detailed description given hereinbelow and the accompanying drawings, which are given by way of illusion only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
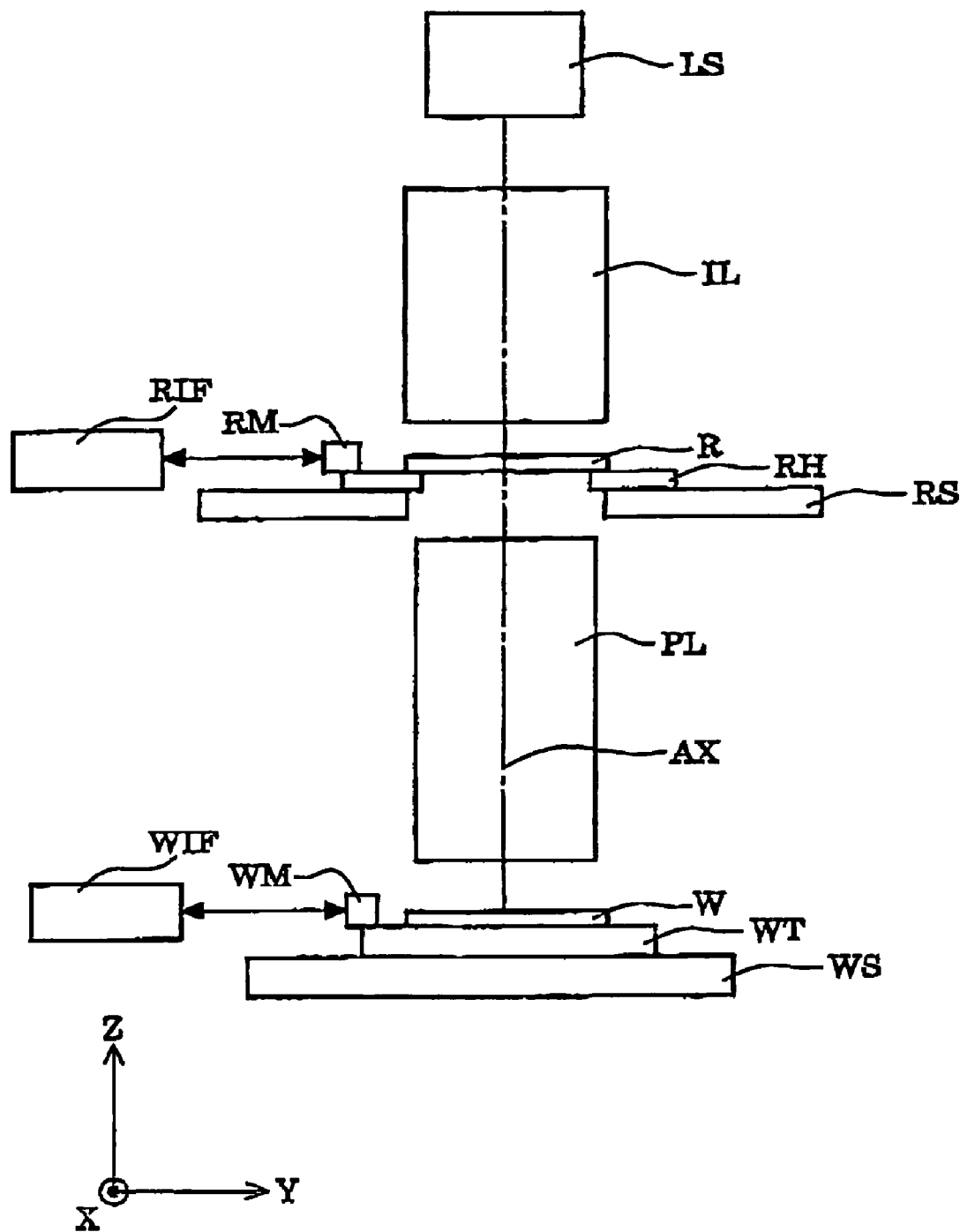
FIG. 1 is an illustration schematically showing a configuration of an exposure apparatus with a projection optical system according to an embodiment of the present invention.

The projection optical system of the present invention has the first light transmitting member with substantially no refracting power placed nearest to the image (the second surface) and satisfies Condition (1) below. In Condition (1), WD is the distance along the optical axis between the first light transmitting member and the image surface (i.e., working distance), and NA the image-side numerical aperture of the projection optical system. Furthermore, $L \times 10^{-6}$ is the center wavelength of the used light.

$$0.06 < WD \cdot NA/L < 0.23 \tag{1}$$

In the present invention, the first light transmitting member placed nearest to the image in the projection optical system is constructed of a light transmitting member with substantially no refracting power, for example, like a plane-parallel plate. Therefore, even if the first light transmitting member needs to be replaced with another because of the volumetric change (shape change) caused by compaction of the first light transmitting member made of silica, or even if the first light transmitting member needs to be replaced with another because of contamination caused by degasification, the system is unlikely to be affected by position error or posture error (e.g., decentration error or the like) in conjunction with the replacement of the first light transmitting member and is unlikely to cause surface precision error, and, in turn, it is feasible to reduce the influence of the replacement of the first light transmitting member on the imaging performance.

In the range below the lower limit of Condition (1), the working distance WD is too small, and the fluence of the first light transmitting member is so high that the influence of compaction becomes significant on the first light transmitting member made of silica, which will result in increasing the frequency of replacement of the first light transmitting member. In addition, the working distance WD is so small that the first light transmitting member is ready subject to contamination due to degasification, which will result in increasing the frequency of replacement of the first light transmitting member.

On the other hand, in the range above the upper limit of Condition (1), the working distance WD is too large, and it becomes difficult to suitably compensate for chromatic aberration and spherical aberration. In order to fixer reduce the frequency of replacement of the first light transmitting member and to better compensate for chromatic aberration and spherical aberration, the upper limit of Condition (1) is preferably set to 0.18 and the lower limit thereof to 0.08.

In the present invention the projection optical system has the first light transmitting member with substantially no refracting power placed nearest to the image, and the second light transmitting member placed adjacent on the object side (the first surface side) to the first light transmitting member, and satisfies Condition (2) below. In Condition (2), OD is the air-equivalent length along the optical axis from the second light transmitting member to the image surface. The air-equivalent length OD is expressed by Eq (2a) below.

$$0.1 < OD \cdot NA/L < 0.4 \tag{2}$$

$$OD = WD + (\text{center thickness of the first light transmitting member})/(\text{refractive index of the first light transmitting member}) + (\text{axial separation between the first light transmitting member and the second light transmitting member}) \tag{2a}$$

In the range below the lower limit of Condition (2), the air-equivalent length OD is too small and the fluence of the second light transmitting member is also high as well as the fluence of the first light transmitting member, therefore, it becomes necessary to replace the second light transmitting member as well. On the other hand, in the range above the upper limit of Condition (2), the air-equivalent length OD is so large that it becomes difficult to suitably compensate for chromatic aberration and spherical aberration. In order to more secure suppress the need for replacement of the second light transmitting member and to better compensate for chromatic aberration and spherical aberration, the upper limit of Condition (2) is preferably set to 0.35 and the lower limit thereof to 0.12.

In the present invention, in view of the trend toward the scale-down of patterns in application to the exposure apparatus, it is desirable to use the exposure light with the wavelength of not more than 200 nm and to keep the focal depth as large as possible. In this case, the optical materials that can be used for the light transmitting members are limited to silica and fluorite. If all the light transmitting members constituting the projection optical system are made of silica, it is feasible to avoid the degradation of the imaging performance due to the intrinsic birefringence and the variation of refractive index including the high-frequency components in use of fluorite. Particularly, where the projection optical system is so constructed that the image-side numerical aperture NA is larger than 0.75 and that angular variation of rays is large in the light transmitting members, use of fluorite will tend to increase the influence of intrinsic birefringence, and, therefore, the projection optical system having the light transmitting members all made of silica has a great advantage.

With use of the exposure light having the wavelength of not more than 200 nm, the refractive index of fluorite is lower than that of silica. If the focal lengths are equal, the curvature of the light transmitting member made of fluorite (typically, a lens) must be greater than the curvature of the light transmitting member made of silica, and it tends to become difficult to provide a thin film with uniform thickness on the light transmitting member. For this reason as well, the projection optical system having the light transmitting members all made of silica has a great advantage.

In the present invention, the projection optical system preferably satisfies Condition (3) below. In Condition (3), T is the center thickness of the first light transmitting member.

$$0.04 < T/L < 0.16 \qquad (3)$$

In the range below the lower limit of Condition (3), the center thickness T of the first light transmitting member is too small and the fleece of the second light transmitting member also tends to be high as well as the fluence of the first light transmitting member; therefore, it requires replacement of the second light transmitting member as well and is thus not preferred. In this case, if the working distance WD is increased in order to decrease the fluence of the second light transmitting member, it will be difficult to suitably compensate for chromatic aberration and spherical aberration.

On the other hand, in the range above the upper limit of Condition (3), the center thickness T of the first light transmitting member becomes too large, and the system becomes likely to be affected by difference of homogeneity of internal refractive indices in replacement of the first light transmitting member and by influence of posture difference before and after the replacement, and in turn, to tend to cause degradation of imaging performance, which is not preferred. In order to more securely suppress the need for replacement of the second light transmitting member while well compensating for chromatic aberration and spherical aberration and to better suppress the degradation of imaging performance due to the difference of homogeneity of internal refractive indices and the influence of posture difference before and after the replacement, the upper limit of Condition (3) is preferably set to 0.13 and the lower limit thereof to 0.045.

In the present invention, the projection optical system preferably satisfies Condition (4) below. In Condition (4), ED is the image-side clear aperture radius of the second light transmitting member, and MD the maximum clear aperture radius among all the light transmitting members constituting the projection optical system.

$$0.28 < ED \cdot NA/MD < 0.6 \qquad (4)$$

In the range below the lower limit of Condition (4), the image-side clear aperture radius ED of the second light transmitting member becomes too small, and the fluence of the second light transmitting member also tends to be high as well as the fluence of the first light transmitting member, and the need for replacement of the second light transmitting member is raised as well, which is not preferred. On the other hand, in the range above the upper limit of Condition (4), the image-side clear aperture radius ED of the second light transmitting member is too large, and it becomes difficult to suitably compensate for chromatic aberration and spherical aberration, which is not preferred. In order to more securely suppress the need for replacement of the second light transmitting member and to better compensate for chromatic aberration and spherical aberration, the upper limit of Condition (4) is preferably set to 0.55, and the lower limit thereof to 0.30.

The present invention adopts the replaceable configuration for the first light transmitting member with substantially no refracting power arranged nearest to the image in the projection optical system, whereby the entire projection optical system does not have to be replaced even if the first light transmitting member undergoes shape change due to compaction or even if the first light transmitting member is affected by contamination due to degasification; therefore, good imaging performance can be provided over a long period of time simply by replacement of the first light transmitting member with another.

In the projection optical system of the present invention, as described above, where, for example, the ArF excimer laser beam is used, it is feasible to secure good imaging performance over a long period of time, while avoiding the influence of the variation of refractive index including the high-frequency components and the influence of intrinsic birefringence of fluorite. Therefore, the exposure apparatus and exposure method with the projection optical system of the present invention are able to perform good projection exposure with high resolution through the projection optical system capable of securing the good imaging performance over a long period of time, for example, for the ArF excimer laser beam.

An embodiment of the present invention will be described on the basis of the accompanying drawings.

FIG. 1 is an illustration schematically showing a configuration of an exposure apparatus provided with a projection optical system according to an embodiment of the present invention. In FIG. 1, the Z-axis is set in parallel with the optical axis AX of the projection optical system PL, the Y-axis in parallel with the plane of FIG. 1 in the plane normal to the optical axis AX, and the X-axis along a normal to the plane of FIG. 1 in the plane normal to the optical axis AX.

The exposure apparatus shown in FIG. 1 is equipped with an ArF excimer laser light source (wavelength 193.306 nm) as a light source LS for supplying illumination light. Light emitted from the light source LS travels through an illumination optical system IL to illuminate a reticle (mask) R as an original projection plate with a predetermined pattern thereon. The illumination optical system IL is comprised of a fly's eye lens for uniformizing an illuminance distribution of exposure light, an illumination aperture stop, a variable field stop (reticle blind), a condenser lens system, and so on.

The reticle R is held in parallel with the XY plane on a reticle stage RS through a reticle holder RH. The reticle stage RS is two-dimensionally movable along the reticle plane (i.e., XY plane) by action of a driving system not shown, and is arranged so that its positional coordinates are measured by an interferometer RIF using a reticle moving mirror RM and so that the position thereof is controlled based thereon. The light from the pattern formed on the reticle R travels through a projection optical system PL to form a reticle pattern image on a wafer W coated with a photoresist (photosensitive substrate).

At this time, images of secondary light sources on the illumination pupil surface of the illumination optical system IL are formed at the pupil position of the projection optical system PL, and the wafer W is subjected to Köhler illumination with the light through the projection optical system PL.

The wafer W is held in parallel with the XY plane on a wafer stage WS through a wafer table (wafer holder) WT. The wafer stage WS is two-dimensionally movable along the wafer plane (i.e., XY plane) by action of a driving system not shown, and is arranged so that its positional coordinates are measured by an interferometer WIF using a wafer moving mirror WM and so that the position thereof is controlled based thereon.

In the present embodiment, as described above, one-shot exposure is cried out while two-dimensionally driving and controlling the wafer W in the plane (XY plane) perpendicular to the optical axis AX of the projection optical system PL, whereby the pattern of the reticle R is sequentially projected into each shot area of wafer W in accordance with the so-called step-and-repeat method. Each of examples of the projection optical system PL of the present embodiment will be described below, based on specific numerical examples.

In each example, all the light transmitting members (lenses, plane-parallel plate, etc.) constituting the projection optical system PL are made of silica. The center wavelength of the ArF excimer oscillation laser beam being the exposure light is 193.306 nm, and the refractive index of silica for a band of wavelengths around 193.306 nm varies at the rate of $-1.591 \times 10^{-6}$ per wavelength change of $+1$ pm, and at the rate of $+1.591 \times 10^{-6}$ per wavelength change of $-1$ pm. In other words, in the band of wavelengths around 193.306 nm, the dispersion of refractive index of silica (dn/dλ) is $-1.591 \times 10^{-6}$/pm.

In each example, therefore, the refractive index of silica for the center wavelength 193.306 nm is 1.5603261, the refractive index of silica for 193.306 nm+0.125 pm=193.306125 nm is 1.560325901, and the active index of silica for the wavelength 193.306 nm−0.125 pm=193.305875 nm is 1.560326299.

In each example, an aspherical surface is expressed by Equation (a) below, where y represents a height in the direction normal to the optical axis, z a distance (sag amount) along the optical axis from a tangent plane at the vertex of the aspherical surface to a position on the aspherical surface at the height y, r a radius of curvature at the vertex, κ a conic coefficient, and $C_n$ n-order aspherical coefficients. In each example, a lens surface of aspherical shape is accompanied by mark * on the right side of a surface number.

$$z = (y^2/r)/\left[1 + \{1 - (1+\kappa) \cdot y^2/r^2\}^{1/2}\right] + C_4 \cdot y^4 + C_6 \cdot y^6 + C_8 \cdot y^8 + C_{10} \cdot y^{10} + C_{12} \cdot y^{12} + C_{14} \cdot y^{14} \quad (a)$$

FIRST EXAMPLE

Figure 2:
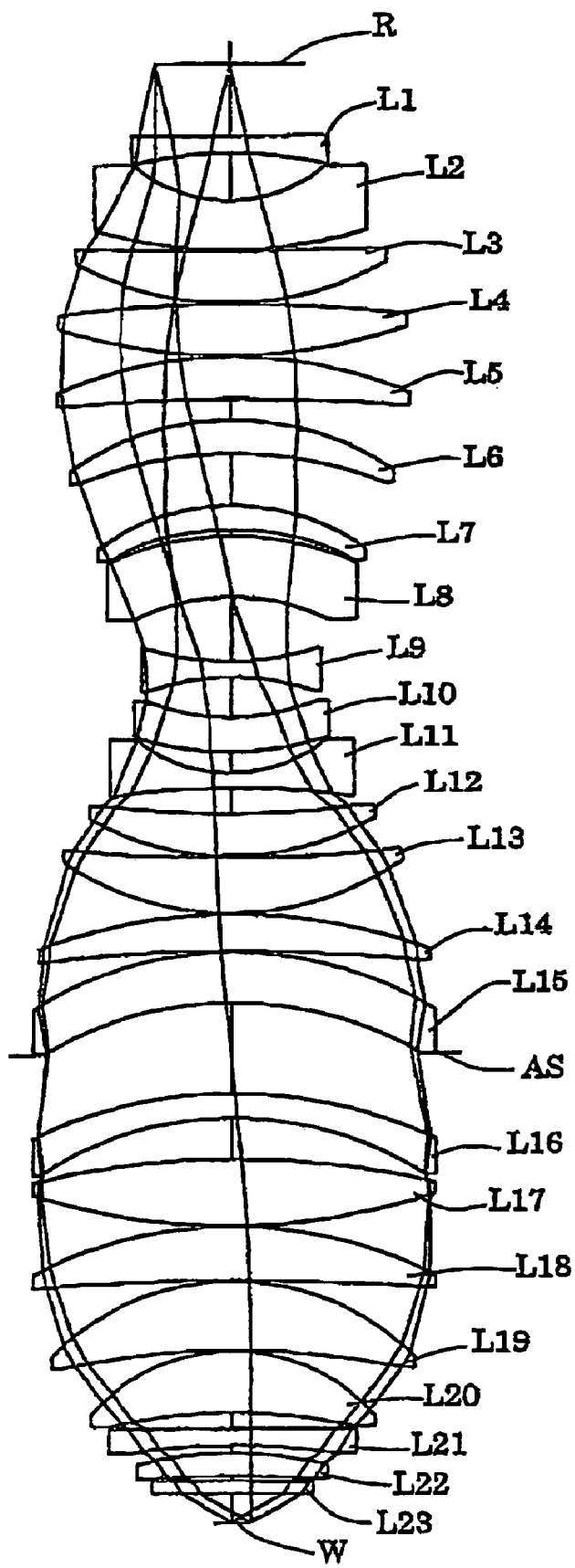
FIG. 2 is an illustration showing a lens configuration of a projection optical system according to a first example.

FIG. 2 is an illusion showing a lens configuration of the projection optical system in the first example. With reference to FIG. 2, the projection optical system PL of the first example is composed of the following elements arranged from the reticle side: a bi-concave lens L1 whose concave surface of aspherical shape is kept toward the wafer, a negative meniscus lens L2 whose concave surface is kept toward the reticle; a positive meniscus lens L3 whose concave surface of aspherical shape is kept toward the reticle; a bi-convex lens L4; a positive meniscus lens L5 whose convex surface is kept toward the reticle; a positive meniscus lens L6 whose convex surface is kept toward the reticle; a positive meniscus lens L7 whose concave surface of aspherical shape is kept toward the wafer; a negative meniscus lens L8 whose convex surface is kept toward the reticle; a bi-concave lens L9; a negative meniscus lens L10 whose concave surface of aspherical shape is kept toward the reticle; a bi-concave lens L11 whose concave surface of aspherical shape is kept toward the wafer; a positive meniscus lens L12 whose concave surface is kept toward the reticle; a positive meniscus lens L13 whose concave surface of aspherical shape is kept toward the reticle; a positive meniscus lens L14 whose convex surface is kept toward the reticle; a positive meniscus lens L15 whose convex surface is kept toward the reticle; an aperture stop AS; a negative meniscus lens L16 whose convex spice is kept toward the reticle; a bi-convex lens L17; a positive meniscus lens L18 whose convex surface is kept toward the reticle; a positive meniscus lens L19 whose concave surface of aspherical shape is kept toward the wafer; a positive meniscus lens L20 whose concave surface of aspherical shape is kept toward the wafer, a bi-concave lens L21; a positive meniscus lens L22 whose convex surface is kept toward the reticle; a plane-parallel plate L23.

In the first example, the plane-parallel plate L23 constitutes the first light transmitting member with substantially no refracting power arranged nearest to the image in the projection optical system PL. The positive mows lens L22 constitutes the second light transmitting member arranged adjacent on the object side to the plane-parallel plate L23 as the first light twitting member.

Table (1) below presents a list of values of specifications of the projection optical system PL in the first example. In the principal specifications of Table (1), λ represents the center wavelength of exposure light, β a projection magnification, NA the image-side (wafer side) numerical aperture, and $Y_0$ a maximum image height. In the specifications of the optical members in Table (1), the surface number represents a sequential number of each optical surface from the reticle side, r a radius of curvature of each optical surface (a radius of curvature at the vertex in the case of an aspherical surface: mm), d a spacing of each optical surface along the optical axis or surface separation (mm) of each optical surface, φ a clear aperture radius (mm), and n the refractive index for the center wavelength of exposure light. The notations described above also apply to Table (2) hereinafter.

TABLE 1

(PRINCIPAL SPECIFICATIONS)

λ = 193.306 nm
β = −0.25
NA = 0.85
$Y_0$ = 13.8 mm (SPECIFICATIONS OF OPTICAL MEMBERS)

| Surface number | r | d | φ | n |
|---|---|---|---|---|
|  | (Reticle Surface) | 55.52745 | 55.200 |  |
| 1 | −4301.64975 | 13.00000 | 67.154 | 1.5603261 (L1) |
| 2* | 235.05077 | 37.32675 | 70.288 |  |
| 3 | −105.68367 | 38.95787 | 70.881 | 1.5603261 (L2) |
| 4 | −352.42347 | 1.00000 | 98.442 |  |
| 5* | −3306.33163 | 42.10999 | 107.812 | 1.5603261 (L3) |
| 6 | −221.99706 | 1.00000 | 112.909 |  |
| 7 | 938.62272 | 41.21262 | 125.243 | 1.5603261 (L4) |
| 8 | −400.97405 | 1.00000 | 126.929 |  |
| 9 | 304.53411 | 34.53836 | 128.498 | 1.5603261 (L5) |
| 10 | 1347.59347 | 16.80581 | 126.758 |  |
| 11 | 193.90669 | 27.60402 | 118.023 | 1.5603261 (L6) |
| 12 | 275.45891 | 42.94852 | 113.601 |  |
| 13 | 159.79677 | 19.75835 | 97.159 | 1.5603261 (L7) |
| 14* | 208.00919 | 4.93838 | 91.511 |  |

TABLE 1-continued

| | | | | |
|---|---|---|---|---|
| 15 | 206.31385 | 49.89381 | 91.194 | 1.5603261 (L8) |
| 16 | 148.27590 | 52.80319 | 72.066 | |
| 17 | −191.64685 | 13.00000 | 64.632 | 1.5603261 (L9) |
| 18 | 172.07761 | 32.77257 | 62.515 | |
| 19* | −139.99994 | 27.73868 | 63.494 | 1.5603261 (L10) |
| 20 | −221.74551 | 17.10708 | 70.129 | |
| 21 | −105.30866 | 13.00000 | 70.375 | 1.5603261 (L11) |
| 22* | 1033.26067 | 20.53004 | 88.992 | |
| 23 | −752.35793 | 34.94635 | 96.746 | 1.5603261 (L12) |
| 24 | −199.99484 | 1.00000 | 104.023 | |
| 25* | −2522.70434 | 45.66430 | 118.717 | 1.5603261 (L13) |
| 26 | −213.64936 | 1.00000 | 123.781 | |
| 27 | 392.57549 | 29.64824 | 142.568 | 1.5603261 (L14) |
| 28 | 1104.23472 | 1.00000 | 142.850 | |
| 29 | 259.26061 | 42.04506 | 146.995 | 1.5603261 (L15) |
| 30 | 259.83950 | 42.28274 | 140.529 | |
| 31 | ∞ | 31.10788 | 140.613 | (AS) |
| 32 | 324.55702 | 20.04862 | 147.500 | 1.5603261 (L16) |
| 33 | 247.93235 | 32.97227 | 144.589 | |
| 34 | 583.35071 | 53.61400 | 146.198 | 1.5603261 (L17) |
| 35 | −483.70285 | 1.00000 | 147.338 | |
| 36 | 308.09638 | 43.00000 | 147.487 | 1.5603261 (L18) |
| 37 | 1600.96166 | 1.00000 | 145.229 | |
| 38 | 183.06681 | 54.45649 | 132.691 | 1.5603261 (L19) |
| 39* | 510.56095 | 1.00139 | 126.784 | |
| 40 | 136.05396 | 49.04541 | 103.412 | 1.5603261 (L20) |
| 41* | 388.74203 | 12.87289 | 92.816 | |
| 42 | −47557.51430 | 13.00000 | 90.418 | 1.5603261 (L21) |
| 43 | 523.12713 | 5.77866 | 78.199 | |
| 44 | 269.78156 | 18.56955 | 68.398 | 1.5603261 (L22) |
| 45 | 795.95954 | 3.75547 | 59.834 | |
| 46 | ∞ | 10.00000 | 57.408 | 1.5603261 (L23) |
| 47 | ∞ | 22.99997 | 50.912 | |
| (Wafer surface) | | | | |

(Data of aspherical surfaces)

2nd surface $\kappa = 0.000000$
$C_4 = -1.12995 \times 10^{-7}$    $C_6 = 3.51968 \times 10^{-12}$
$C_8 = -1.66729 \times 10^{-16}$    $C_{10} = 9.06568 \times 10^{-21}$
$C_{12} = 6.99526 \times 10^{-25}$    $C_{14} = -6.82623 \times 10^{-29}$ 5th surface $\kappa = 0.000000$
$C_4 = 7.27273 \times 10^{-9}$    $C_6 = -5.58323 \times 10^{-13}$
$C_8 = 1.29651 \times 10^{-17}$    $C_{10} = 3.10259 \times 10^{-22}$
$C_{12} = -2.73574 \times 10^{-26}$    $C_{14} = 6.04993 \times 10^{-31}$ 14th surface $\kappa = 0.000000$
$C_4 = 5.24802 \times 10^{-8}$    $C_6 = 3.13148 \times 10^{-13}$
$C_8 = 3.70056 \times 10^{-17}$    $C_{10} = 5.41656 \times 10^{-22}$
$C_{12} = 6.19413 \times 10^{-26}$    $C_{14} = -1.42587 \times 10^{-30}$ 19th surface $\kappa = 0.000000$
$C_4 = 1.06843 \times 10^{-7}$    $C_6 = -2.12612 \times 10^{-12}$
$C_8 = 4.59938 \times 10^{-16}$    $C_{10} = 1.05694 \times 10^{-20}$
$C_{12} = -4.98720 \times 10^{-25}$    $C_{14} = 4.39416 \times 10^{-28}$ 22nd surface $\kappa = 0.000000$
$C_4 = 8.31080 \times 10^{-8}$    $C_6 = -6.69297 \times 10^{-12}$
$C_8 = 4.15386 \times 10^{-16}$    $C_{10} = -1.89295 \times 10^{-20}$
$C_{12} = 6.74235 \times 10^{-25}$    $C_{14} = -1.30608 \times 10^{-29}$ 25th surface $\kappa = 0.000000$
$C_4 = -1.55548 \times 10^{-8}$    $C_6 = 5.04132 \times 10^{-14}$
$C_8 = -1.38895 \times 10^{-19}$    $C_{10} = -2.81237 \times 10^{-22}$
$C_{12} = 9.50481 \times 10^{-27}$    $C_{14} = -2.36931 \times 10^{-31}$ 39th surface $\kappa = 0.000000$
$C_4 = -9.35827 \times 10^{-9}$    $C_6 = 3.38312 \times 10^{-13}$
$C_8 = -3.84156 \times 10^{-18}$    $C_{10} = -3.53296 \times 10^{-22}$
$C_{12} = 1.35255 \times 10^{-26}$    $C_{14} = -2.58661 \times 10^{-31}$ TABLE 1-continued 41st surface $\kappa = 0.000000$
$C_4 = 1.58322 \times 10^{-8}$    $C_6 = -2.47355 \times 10^{-12}$
$C_8 = 9.32849 \times 10^{-17}$    $C_{10} = -1.94029 \times 10^{-21}$
$C_{12} = 6.02892 \times 10^{-26}$    $C_{14} = -1.18291 \times 10^{-30}$ (Corresponding values to Conditions)

WD = 22.99997 mm
NA = 0.85
$\lambda = L \times 10^{-6}$ mm = 193.306 $\times 10^{-6}$ mm
OD = 33.1644 mm
T = 10 mm
ED = 59.834 mm
MD = 147.5 mm (Object-side surface of lens L16)
(1) WD · NA/L = 0.101
(2) OD · NA/L = 0.146
(3) T/L = 0.052
(4) ED · NA/MD = 0.345

Figure 3:
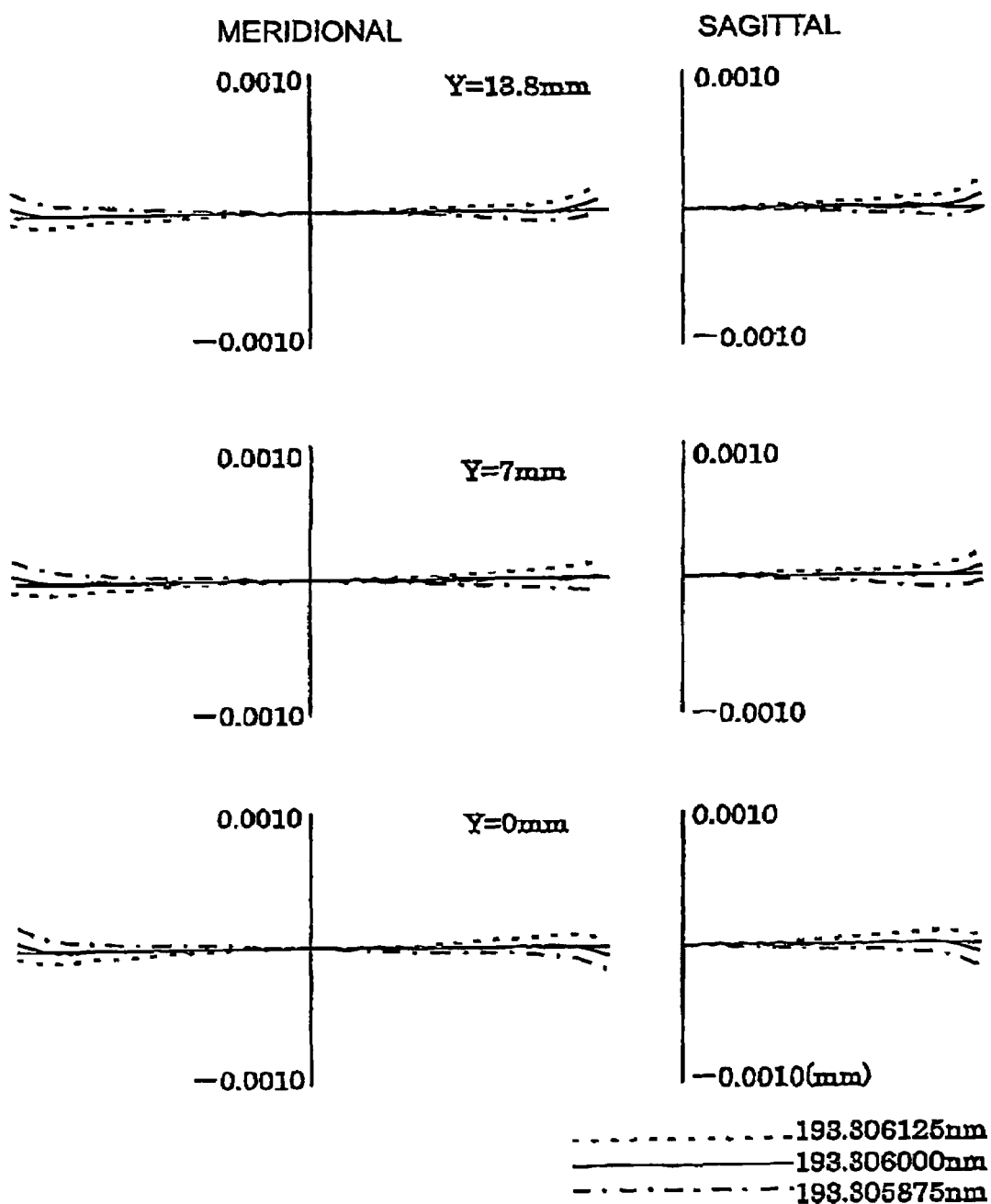
FIG. 3 is an illustration showing transverse aberration in the first example.

FIG. 3 is an illustration showing the transverse aberration in the first example. In the aberration diagram, Y represents an image height, a solid line the center wavelength 193.306 nm, a dashed line the wavelength 193.306 nm+0.125 pm=193.306125 nm, and a chain line the wavelength 193.306 nm−0.125 pm=193.305875 nm. The above notations also apply to FIG. 5 hereinafter. As apparent from the aberration diagram, the chromatic aberration is compensated well for the exposure light with the wavelength band of 193.306 nm±0.125 pm in the first example.

SECOND EXAMPLE

Figure 4:
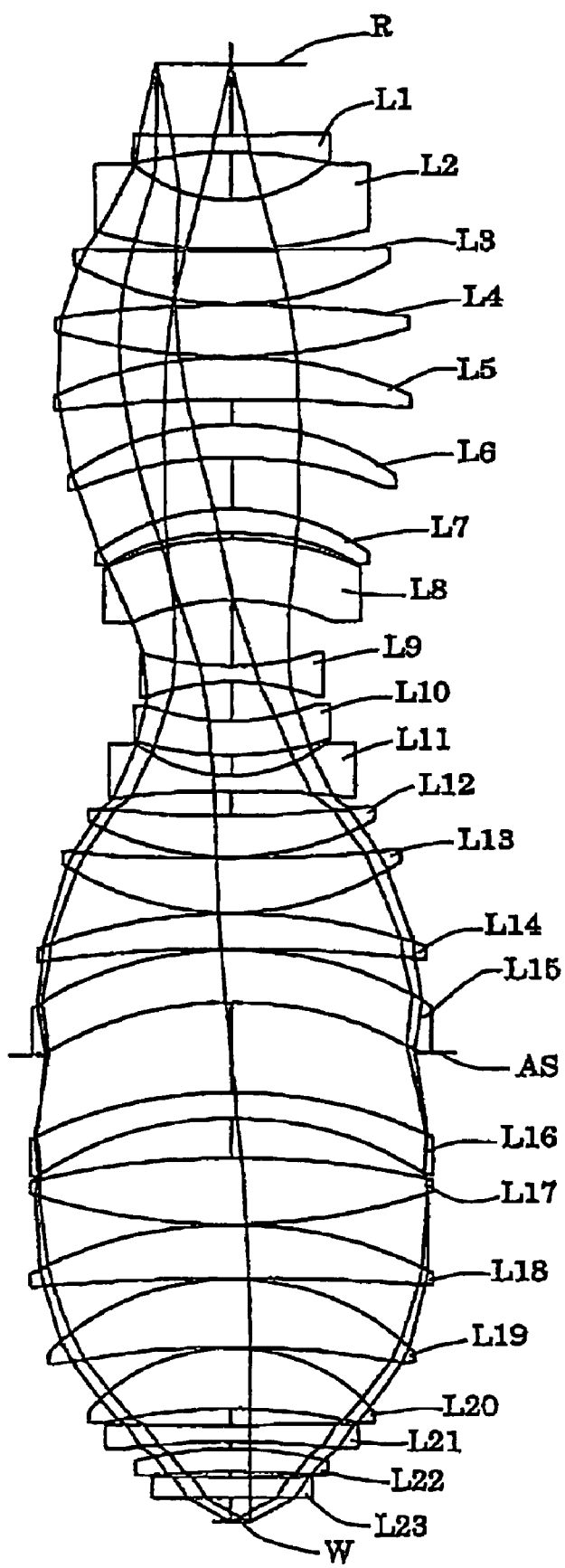
FIG. 4 is an illustration showing a lens configuration of a projection optical system according to a second example.

FIG. 4 is an illustration showing a lens configuration of the projection optical system in the second example. With reference to FIG. 4, the projection optical system PL of the second example is composed of the following elements arranged in order from the reticle side: a bi-concave lens L1 whose concave surface of aspherical shape is kept toward the wafer; a negative meniscus lens L2 whose concave surface is kept toward the reticle; a positive meniscus lens L3 whose concave surface of aspherical shape is kept toward the reticle; a bi-convex lens L4; a positive meniscus lens L5 whose convex surface is kept toward the reticle; a positive meniscus lens L6 whose convex surface is kept toward the reticle; a positive meniscus lens L7 whose concave suite of aspherical shape is kept toward the wafer; a negative meniscus lens L8 whose convex surface is kept toward the reticle; a bi-concave lens L9; a negative meniscus lens L10 whose concave surface of aspherical shape is kept toward the reticle; a bi-concave lens L11 whose concave surface of aspherical shape is kept toward the wafer, a positive meniscus lens L12 whose concave surface is kept toward the reticle; a positive meniscus lens L13 whose concave surface of aspherical shape is kept toward the reticle; a positive meniscus lens L14 whose convex surface is kept toward the reticle; a negative meniscus lens L15 whose convex surface is kept toward the reticle; an aperture stop AS; a negative meniscus lens L16 whose convex surface is kept toward the reticle; a bi-convex lens L17; a positive meniscus lens L18 whose convex surface is kept toward the reticle; a positive meniscus lens L19 whose concave surface of aspherical shape is kept toward the wafer, a positive meniscus lens L20 whose concave surface of aspherical shape is kept toward the wafer, a bi-concave lens L21; a positive meniscus lens L22 whose convex surface is kept toward the reticle; a plane-parallel plate L23.

In the second example, the plane-parallel plate L23 also constitutes the first light transmitting member with substantially no refracting power arranged nearest to the image in the projection optical system PL, and the positive meniscus lens L22 also constitutes the second light transmitting member arranged adjacent on the object side to the plane-parallel plate L23 as the first light transmitting member. Table (2) below presents a list of values of specifications of the projection optical system PL in the second example.

TABLE 2

(PRINCIPAL SPECIFICATIONS)

$\lambda$ = 193.306 nm
$\beta$ = −0.25
NA = 0.85
$Y_0$ = 13.8 mm (SPECIFICATIONS OF OPTICAL MEMBERS)

| Surface number | r | d | φ | n |
|---|---|---|---|---|
|  | (Reticle surface) | 55.50274 | 55.200 |  |
| 1 | −4512.88571 | 13.00000 | 67.154 | 1.5603261 (L1) |
| 2* | 233.09317 | 37.30068 | 70.296 |  |
| 3 | −106.13950 | 39.92677 | 70.892 | 1.5603261 (L2) |
| 4 | −349.76395 | 1.00000 | 98.762 |  |
| 5* | −2684.70790 | 43.00937 | 108.062 | 1.5603261 (L3) |
| 6 | −225.57928 | 1.00000 | 113.665 |  |
| 7 | 880.71622 | 41.51791 | 126.298 | 1.5603261 (L4) |
| 8 | −414.03174 | 1.00000 | 127.948 |  |
| 9 | 296.12925 | 34.34760 | 129.603 | 1.5603261 (L5) |
| 10 | 1074.46908 | 20.35156 | 127.781 |  |
| 11 | 194.09080 | 27.41351 | 118.827 | 1.5603261 (L6) |
| 12 | 271.56589 | 42.67649 | 114.410 |  |
| 13 | 158.59079 | 19.49484 | 98.267 | 1.5603261 (L7) |
| 14* | 204.71122 | 5.24503 | 92.643 |  |
| 15 | 201.20483 | 50.00000 | 92.291 | 1.5603261 (L8) |
| 16 | 157.07064 | 54.84483 | 73.743 |  |
| 17 | −198.50398 | 13.00000 | 65.194 | 1.5603261 (L9) |
| 18 | 162.60193 | 32.54644 | 62.684 |  |
| 19* | −139.99994 | 27.79910 | 63.531 | 1.5603261 (L10) |
| 20 | −223.14654 | 16.83104 | 70.183 |  |
| 21 | −106.43470 | 13.00000 | 70.430 | 1.5603261 (L11) |
| 22* | 1116.03406 | 20.34258 | 88.617 |  |
| 23 | −725.22712 | 33.88230 | 96.129 | 1.5603261 (L12) |
| 24 | −205.12321 | 1.00000 | 103.474 |  |
| 25* | −2581.64451 | 44.89129 | 117.695 | 1.5603261 (L13) |
| 26 | −215.09878 | 1.00000 | 122.735 |  |
| 27 | 389.23259 | 29.17301 | 141.442 | 1.5603261 (L14) |
| 28 | 1068.92438 | 1.00000 | 141.745 |  |
| 29 | 258.73442 | 43.12264 | 145.997 | 1.5603261 (L15) |
| 30 | 254.29098 | 42.59460 | 139.366 |  |
| 31 | ∞ | 31.26179 | 139.466 | (AS) |
| 32 | 315.23544 | 21.43176 | 147.500 | 1.5603261 (L16) |
| 33 | 248.41690 | 31.99817 | 144.507 |  |
| 34 | 596.69682 | 53.38162 | 145.550 | 1.5603261 (L17) |
| 35 | −475.61604 | 1.00000 | 146.933 |  |
| 36 | 306.94151 | 43.00000 | 147.487 | 1.5603261 (L18) |
| 37 | 1563.74320 | 1.00000 | 145.266 |  |
| 38 | 186.37551 | 54.77850 | 133.289 | 1.5603261 (L19) |
| 39* | 553.08511 | 1.00000 | 127.521 |  |
| 40 | 136.54311 | 48.40196 | 103.529 | 1.5603261 (L20) |
| 41* | 392.25070 | 12.70919 | 93.517 |  |
| 42 | −81942.07109 | 13.00000 | 91.091 | 1.5603261 (L21) |
| 43 | 543.20016 | 5.99451 | 78.901 |  |
| 44 | 261.28781 | 18.39476 | 68.256 | 1.5603261 (L22) |
| 45 | 661.61806 | 4.18857 | 59.541 |  |
| 46 | ∞ | 17.00000 | 57.115 | 1.5603261 (L23) |
| 47 | ∞ | 19.99997 | 46.071 |  |
|  | (Wafer surface) |  |  |  |

(Data of aspherical surfaces)

2nd surface $\kappa$ = 0.000000
$C_4$ = −1.10877 × 10$^{-7}$     $C_6$ = 3.30068 × 10$^{-12}$ TABLE 2-continued $C_8$ = −1.67232 × 10$^{-16}$     $C_{10}$ = 1.07969 × 10$^{-20}$
$C_{12}$ = 2.96276 × 10$^{-25}$     $C_{14}$ = −4.92467 × 10$^{-29}$ 5th surface $\kappa$ = 0.000000
$C_4$ = 9.16071 × 10$^{-9}$     $C_6$ = −6.08706 × 10$^{-13}$
$C_8$ = 1.24368 × 10$^{-17}$     $C_{10}$ = 4.06597 × 10$^{-22}$
$C_{12}$ = −3.24786 × 10$^{-26}$     $C_{14}$ = 7.10607 × 10$^{-31}$ 14th surface $\kappa$ = 0.000000
$C_4$ = 5.37671 × 10$^{-8}$     $C_6$ = 3.75624 × 10$^{-13}$
$C_8$ = 4.02159 × 10$^{-17}$     $C_{10}$ = 7.01569 × 10$^{-22}$
$C_{12}$ = 6.86623 × 10$^{-26}$     $C_{14}$ = −8.30153 × 10$^{-31}$ 19th surface $\kappa$ = 0.000000
$C_4$ = 1.07793 × 10$^{-7}$     $C_6$ = −2.02914 × 10$^{-12}$
$C_8$ = 4.94033 × 10$^{-16}$     $C_{10}$ = 6.19113 × 10$^{-21}$
$C_{12}$ = −2.25700 × 10$^{-25}$     $C_{14}$ = 2.42928 × 10$^{-28}$ 22nd surface $\kappa$ = 0.000000
$C_4$ = 8.24937 × 10$^{-8}$     $C_6$ = −6.47608 × 10$^{-12}$
$C_8$ = 4.24568 × 10$^{-16}$     $C_{10}$ = −2.14566 × 10$^{-20}$
$C_{12}$ = 8.38662 × 10$^{-25}$     $C_{14}$ = −1.70889 × 10$^{-29}$ 25th surface $\kappa$ = 0.000000
$C_4$ = −1.53649 × 10$^{-8}$     $C_6$ = 4.77070 × 10$^{-14}$
$C_8$ = 1.36163 × 10$^{-18}$     $C_{10}$ = −3.41754 × 10$^{-22}$
$C_{12}$ = 1.18597 × 10$^{-26}$     $C_{14}$ = −2.74733 × 10$^{-31}$ 39th surface $\kappa$ = 0.000000
$C_4$ = −9.38590 × 10$^{-9}$     $C_6$ = 3.29997 × 10$^{-13}$
$C_8$ = −3.34030 × 10$^{-18}$     $C_{10}$ = −3.96993 × 10$^{-22}$
$C_{12}$ = 1.47536 × 10$^{-26}$     $C_{14}$ = −2.71041 × 10$^{-31}$ 41st surface $\kappa$ = 0.000000
$C_4$ = 1.41339 × 10$^{-8}$     $C_6$ = −2.52410 × 10$^{-12}$
$C_8$ = 8.19798 × 10$^{-17}$     $C_{10}$ = −6.57981 × 10$^{-22}$
$C_{12}$ = 3.88607 × 10$^{-27}$     $C_{14}$ = −1.07387 × 10$^{-31}$ (Corresponding values to Conditions)

WD = 19.99997 mm
NA = 0.85
$\lambda$ = L × 10$^{-6}$ mm = 193.306 × 10$^{-6}$ mm
OD = 35.0837 mm
T = 17 mm
ED = 59.541 mm
MD = 147.5 mm (Object-side surface of lens L16)
(1) WD · NA/L = 0.088
(2) OD · NA/L = 0.154
(3) T/L = 0.088
(4) ED · NA/MD = 0.343

Figure 5:
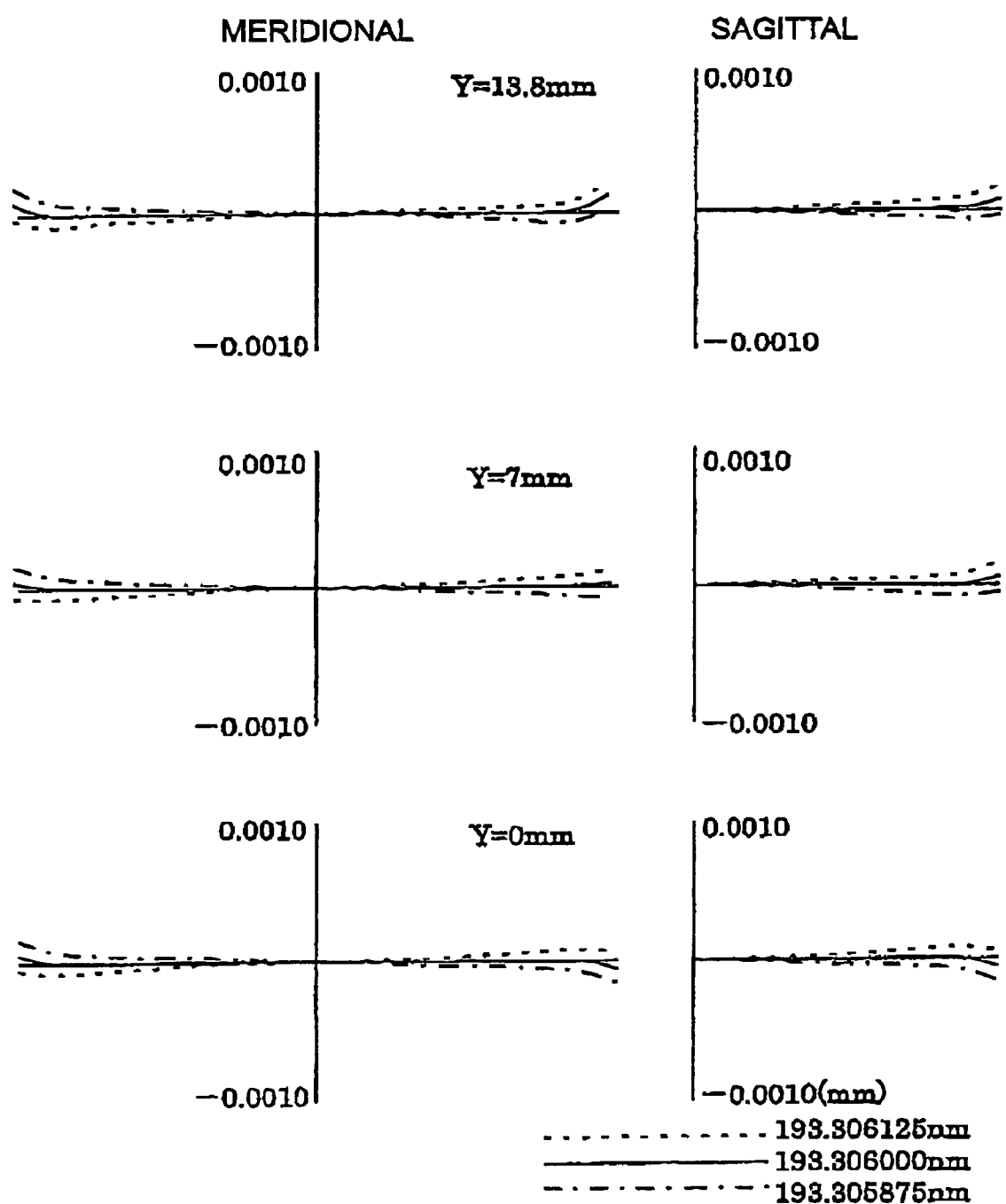
FIG. 5 is an illustration showing transverse aberration in the second example.

FIG. 5 is an illustration showing the transverse aberration in the second ample. As apparent from the aberration diagram, in the second example, the chromatic aberration is compensated well for the exposure light with the wavelength band of 193.306 nm±0.125 pm, as in the first example.

In each of the examples of the present embodiment, where the plane-parallel plate (first light transmitting member) L23 located nearest to the image undergoes shape change due to compaction or where the plane-parallel plate L23 is affected by contamination due to degasification from the wafer W, so as to degrade the imaging performance of the projection optical system PL, the plane-parallel plate L23 will be replaced with another plane-parallel plate for replacement (light transmitting member for replacement), whereby the imaging performance of the projection optical system PL can be kept in good condition over a long period of time.

The exposure apparatus of the above described embodiment can be arranged to illuminate the reticle (mask) by the illumination system (illumination step) and to project the pattern for transcription formed on the mask, onto the photosensitive substrate by the projection optical system (exposure step), thereby producing micro devices (semiconductor devices, image pickup elements, liquid crystal display elements, thin film magnetic heads, etc.). An example of a procedure for obtaining semiconductor devices as micro devices by forming a predetermined circuit pattern on a wafer or the like as a photosensitive substrate by means of the exposure apparatus of the present embodiment will be described below with reference to the flowchart of FIG. 6.

Figure 6:
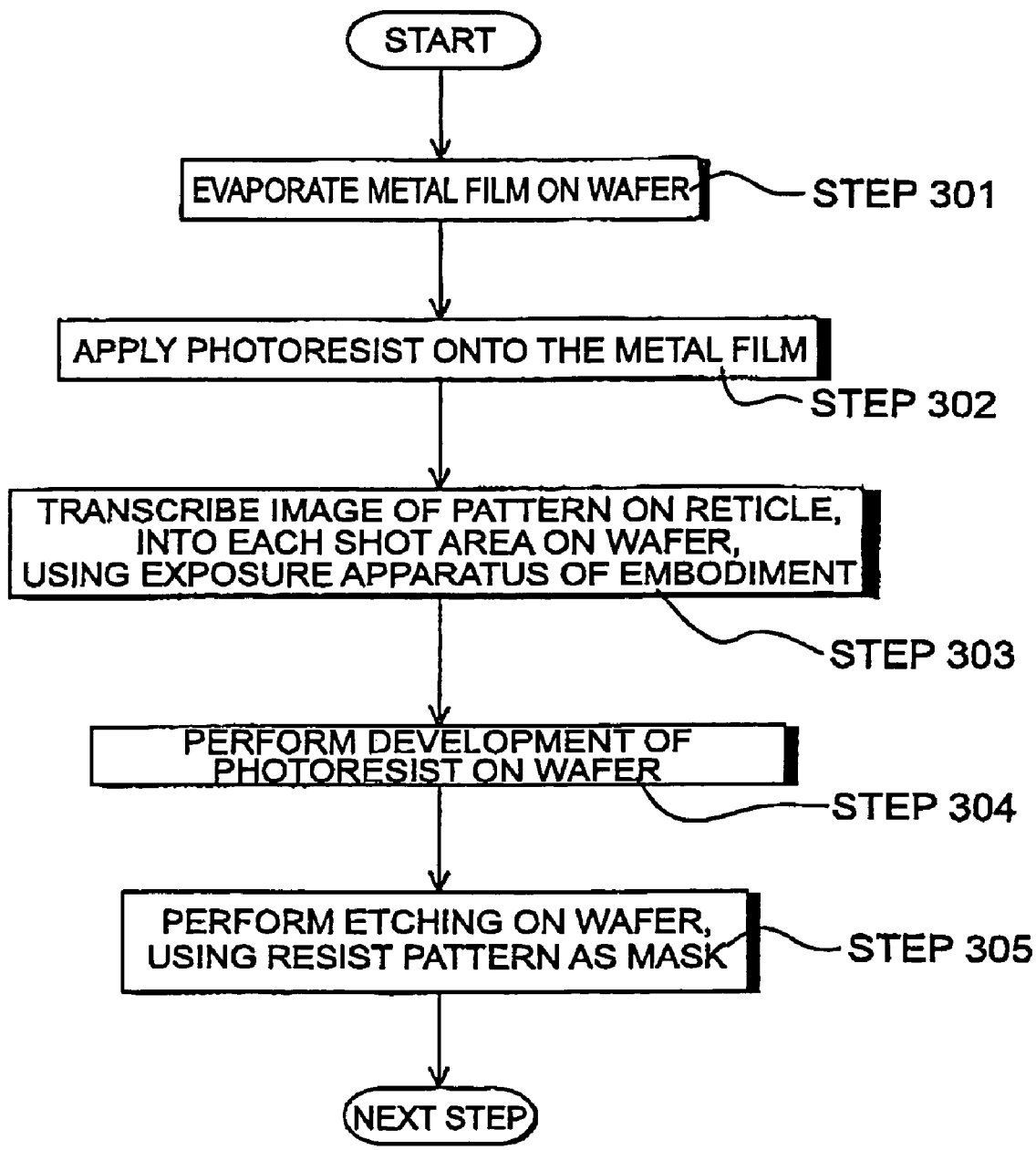
FIG. 6 is a flowchart of a procedure in obtaining semiconductor devices as micro devices.

First, step 301 in FIG. 6 is to evaporate a metal film on each of wafers in one lot. Next step 302 is to apply a photoresist onto the metal film on each of the wafers in the lot. Theater, step 303 is to sequentially transcribe an image of a pattern on a mask into each shot area on each of the wafers in the lot, through the projection optical system, using the exposure apparatus of the present embodiment. Step 304 thereafter is to develop the photoresist on each of the wafers in the lot, and step 305 thereafter is to perform etching with the resist pattern as a mask on each of the wafers in the lot, whereby a circuit pattern corresponding to the pattern on the mask is formed in each shot area on each wafer.

Steps thereafter include formation of a circuit pattern of each upper layer and others, thereby producing such devices as semiconductor devices. The above-described semiconductor device production method enables the semiconductor devices with an extremely fine circuit pattern to be produced at high throughput. Step 301 to step 305 include the evaporation of the metal film on the wafer, the application of the resist onto the metal film, and the steps of exposure, development, and etching, and it is needless to mention that the method may be so arranged that prior to these steps, a silicon oxide film is formed on the wafer, the resist is then applied onto the silicon oxide film, and the steps of exposure, development, etching, and others are carried out thereafter.

Figure 7:
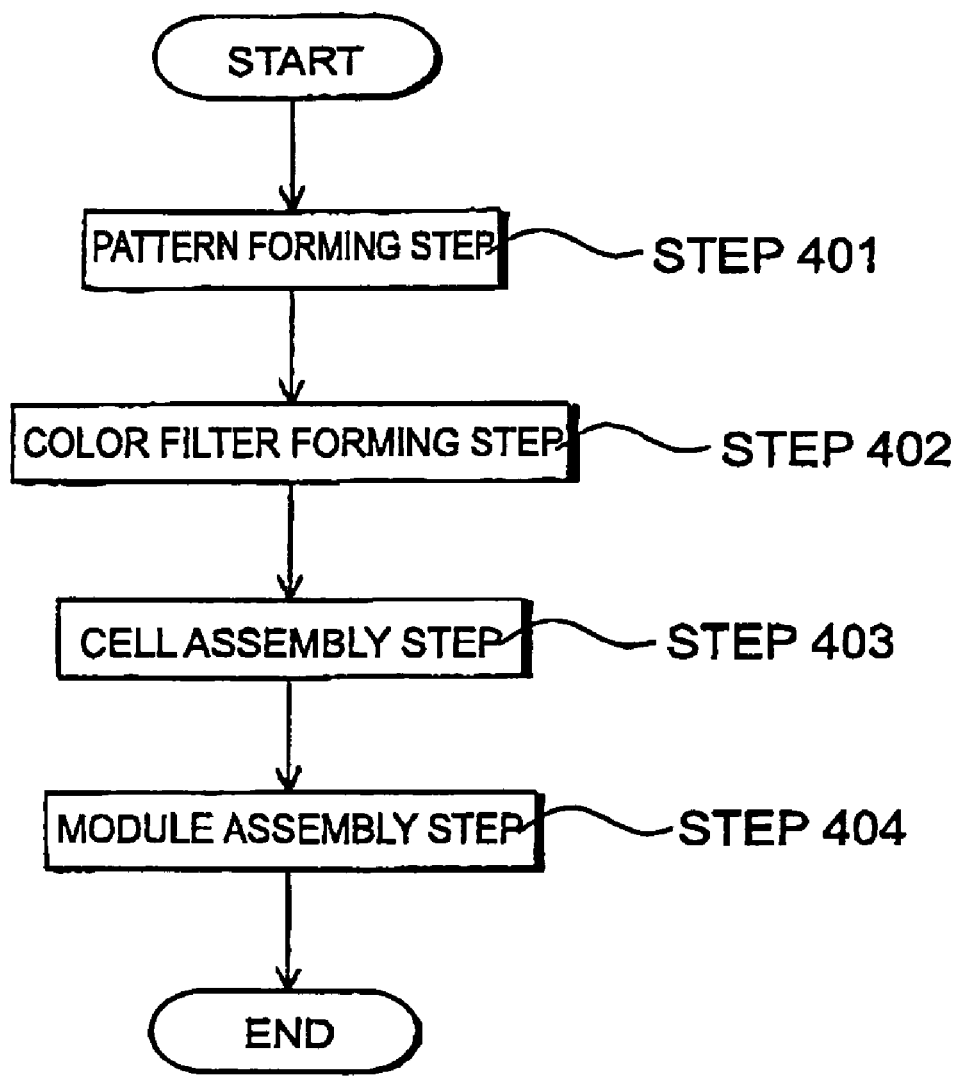
FIG. 7 is a flowchart of a technique in obtaining a liquid crystal display element as a micro device.

The exposure apparatus of the present embodiment can also be used to obtain a liquid crystal display element as a micro device by forming predetermined patterns (circuit pattern electrode pattern, etc.) on a plate (glass substrate). An example of a procedure in this case will be described below with reference to the flowchart of FIG. 7. In FIG. 7, pattern foaming step 401 is to perform a so-called photolithography step of transcribing a pattern of a mask onto a photosensitive substrate (a glass substrate coated with a resist, or the like) by means of the exposure apparatus of the present embodiment. By this photolithography step, the predetermined pattern including a number of electrodes and others is formed on the photosensitive substrate. Thereafter, the exposed substrate is processed through each of steps such as a development step, an etching step, and a resist removing step, whereby the predetermined pattern is formed on the substrate, followed by next color filter forming step 402.

Next, the color filter forming step 402 is to form a color filter in such structure that many sets of three dots corresponding to R (Red), G (Green), and B (Blue) are arrayed in a matrix, or in such structure that a plurality of sets of filters of three stripes of R, G, and B are arrayed in the direction of horizontal scan lines. After the color filter forming step 402, cell assembly step 403 is executed. In the cell assembly step 403, a liquid crystal panel (liquid crystal cell) is assembled using the substrate with the predetermined pattern obtained in the pattern forming step 401, the color filter obtained in the color filter forming step 402, and others. In the cell assembly step 403, the liquid crystal panel (liquid crystal cell) is produced, for example, by introducing a liquid crystal into between the substrate with the predetermined pattern obtained in the pattern forming step 401 and the color filter obtained in the color filter forming step 402.

Module assembly step 404 thereafter is to attach each of components such as an electric circuit for implementing the display operation of the assembled liquid crystal panel (liquid crystal cell), and a backlight, to complete a liquid crystal display element. The production method of the liquid crystal display element described above permits liquid crystal display elements with an extremely fine circuit pattern to be produced at high throughput.

In the embodiment described above, the present invention is applied to the exposure apparatus of the step-and-repeat method for implementing one-shot exposure of the pattern of the reticle R in each exposure area of wafer W. However, without having to be limited to this, the present invention can also be applied to exposure apparatus of the step-and-scan method for implementing scanning exposure of the pattern of the reticle R into each shot area of wafer W while moving the wafer W and reticle R relative to the projection optical system PL.

The aforementioned embodiment was arranged to use the ArF excimer laser light source for supplying the light with the wavelength of 193 nm, but, without having to be limited to this, the present invention can also be applied to other appropriate light sources for supplying light, for example, with the wavelength of not more than 200 nm.

Furthermore, the aforementioned embodiment was the application of the present invention to the projection optical system mounted on the exposure apparatus, but, without having to be limited to this, the present invention can also be applied to other ordinary projection optical systems.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system for forming a demagnified image of a first surface on a second surface, comprising:
   a first light transmitting member with substantially no refracting power placed nearest to the second surface,
   the projection optical system satisfying a condition of:

$$0.08 < WD \cdot NA/L < 0.18,$$

where WD is a distance along the optical axis between the first light transmitting member and the second surface, NA is a numerical aperture on the side of the second surface, and a center wavelength of used light is $L \times 10^{-6}$.

2. The projection optical system according to claim 1, further comprising a second light transmitting member placed adjacent on the first surface side to the first light transmitting member,
   the projection optical system satisfying a condition of:

$$0.1 < OD \cdot NA/L < 0.4,$$

where OD is an air-equivalent length along the optical axis from the second light transmitting member to the second surface, NA is the numerical aperture on the side of the second surface, and the center wavelength of the used light is $L \times 10^{-6}$.

3. The projection optical system according to claim 2, satisfying a condition of:

$$0.12 < OD \cdot NA/L < 0.35.$$

4. The projection optical system according to claim 3, wherein every light transmitting member forming the projection optical system is made of silica and wherein the center wavelength of the used light is not more than 200 nm.

5. The projection optical system according to claim 4, wherein the second-surface-side numerical aperture NA is larger than 0.75.

6. The projection optical system according to claim 4, satisfying a condition of:

$$0.04 < T/L < 0.16,$$

where T is a center thickness of the first light transmitting member and the center wavelength of the used light is $L \times 10^{-6}$.

7. The projection optical system according to claim 6, satisfying a condition of:

$$0.045 < T/L < 0.13.$$

8. The projection optical system according to claim 2, satisfying a condition of:

$$0.28 < ED \cdot NA/MD < 0.6,$$

where ED is a clear aperture radius of the second light transmitting member on the second surface side, NA is the numerical aperture on the second surface side, and MD is a maximum clear aperture radius among every light transmitting member forming the projection optical system.

9. The projection optical system according to claim 8, satisfying a condition of:

$$0.30 < ED \cdot NA/MD < 0.55.$$

10. The projection optical system according to claim 2, wherein the first light transmitting member is arranged to be replaceable.

11. The projection optical system according to claim 1, wherein every light transmitting member forming the projection optical system is made of silica and wherein the center wavelength of the used light is not more than 200 nm.

12. The projection optical system according to claim 11, wherein the second-surface-side numerical aperture NA is larger than 0.75.

13. The projection optical system according to claim 12, satisfying a condition of:

$$0.04 < T/L < 0.16,$$

where T is a center thickness of the first light transmitting member and the center wavelength of the used light is $L \times 10^{-6}$.

14. The projection optical system according to claim 13, satisfying a condition of:

$$0.045 < T/L < 0.13.$$

15. The projection optical system according to claim 11, wherein the first light transmitting member is arranged to be replaceable.

16. The projection optical system according to claim 1, satisfying a condition of:

$$0.04 < T/L < 0.16,$$

where T is a center thickness of the first light transmitting member and the center wavelength of the used light is $L \times 10^{-6}$.

17. The projection optical system according to claim 16, satisfying a condition of:

$$0.045 < T/L < 0.13.$$

18. The projection optical system according to claim 1, wherein the first light transmitting member is arranged to be replaceable.

19. An exposure apparatus comprising:
an illumination system that illuminates a mask set as the first surface; and
the projection optical system as set forth in claim 18, that forms an image of a pattern formed on the mask, on a photosensitive substrate set as the second surface.

20. An exposure apparatus comprising:
an illumination system that illuminates a mask set as the first surface; and
the projection optical system as set forth in claim 1, that forms an image of a pattern formed on the mask, on a photosensitive substrate set as the second surface.

21. An exposure method comprising:
illuminating a mask set as the first surface; and
projecting a pattern formed on the mask, onto a photosensitive substrate set as the second surface, by means of the projection optical system as set forth in claim 1.

22. The exposure method according to claim 21, further comprising:
preparing a light transmitting member for replacement to be replaced with the first light transmitting member in the projection optical system; and
replacing the first light transmitting member with the light transmitting member for replacement prepared.

23. A method of producing a microdevice, comprising:
preparing a substrate coated with a photosensitive material;
preparing a mask on which a predetermined circuit pattern is formed;
setting the mask as the first surface;
illuminating the mask;
projecting the pattern formed on the mask, onto the photosensitive substrate set as the second surface, by means of the projection optical system as set forth in claim 1;
developing the photosensitive material on the substrate; and
forming the predetermined circuit pattern on the substrate, using the photosensitive material after the development, as a mask.

24. The method according to claim 23, further comprising:
preparing a light transmitting member for replacement to be replaced with the first light transmitting member in the projection optical system; and
replacing the first light transmitting member with the light transmitting member for replacement prepared.

25. A projection optical system for forming a demagnified image of a first surface on a second surface, comprising:
a first light transmitting member with substantially no refracting power placed nearest to the second surface; and
a second light transmitting member placed adjacent on the first surface side to the first light transmitting member, the projection optical system satisfying a condition of:

$$0.1 < OD \cdot NA/L < 0.4, \text{ and}$$

$$0.28 < ED \cdot NA/MD < 0.6,$$

where OD is an air-equivalent length along the optical axis from the second light transmitting member to the second surface, NA is a numerical aperture on the side of the second surface, ED is a clear aperture radius of the second light transmitting member on the second surface side, MD is a maximum clear aperture radius among every light transmitting member forming the projection optical system, and a center wavelength of used light is $L \times 10^{-6}$.

every light transmitting member forming the projection optical system is made of silica and wherein the center wavelength of the used light is not more than 200 nm.

26. The projection optical system according to claim 25, satisfying a condition of:

$0.12 < OD \cdot NA/L < 0.35$.

27. The projection optical system according to claim 25, satisfying a condition of:

$0.30 < ED \cdot NA/MD < 0.55$.

28. The projection optical system according to claim 27, satisfying a condition of:

$0.08 < WD \cdot NA/L < 0.18$, where WD is a distance along the optical axis between the first light transmitting member and the second surface, NA is the numerical aperture on the second surface side, and the center wavelength of the used light is $L \times 10^{-6}$.

29. The projection optical system according to claim 25, wherein the second-surface-side numerical aperture NA is larger than 0.75.

30. The projection optical system according to claim 25, satisfying a condition of:

$0.04 < T/L < 0.16$, where T is a center thickness of the first light transmitting member and the center wavelength of the used light is $L \times 10^{-6}$.

31. The projection optical system according to claim 30, satisfying a condition of:

$0.045 < T/L < 0.13$.

32. The projection optical system according to claim 30, satisfying a condition of:

$0.08 < WD \cdot NA/L < 0.18$, where WD is a distance along the optical axis between the first light transmitting member and the second surface, NA is the numerical aperture on the second surface side, and the center wavelength of the used light is $L \times 10^{-6}$.

33. The projection optical system according to claim 25, satisfying a condition of:

$0.28 < ED \cdot NA/MD < 0.6$, where ED is a clear aperture radius of the second light transmitting member on the second surface side, NA is the numerical aperture on the second surface side, and MD is a maximum clear aperture radius among every light transmitting member forming the projection optical system.

34. The projection optical system according to claim 33, satisfying a condition of:

$0.30 < ED \cdot NA/MD < 0.55$.

35. The projection optical system according to claim 33, satisfying a condition of:

$0.08 < WD \cdot NA/L < 0.18$, where WD is a distance along the optical axis between the first light transmitting member and the second surface, NA is the numerical aperture on the second surface side, and the center wavelength of the used light is $L \times 10^{-6}$.

36. The projection optical system according to claim 25, wherein the first light transmitting member is arranged to be replaceable.

37. An exposure apparatus comprising:

an illumination system that illuminates a mask set as the first surface; and the projection optical system as set forth in claim 36, that forms an image of a pattern formed on the mask, on a photosensitive substrate set as the second surface.

38. The projection optical system according to claim 25, satisfying a condition of:

$0.08 < WD \cdot NA/L < 0.18$, where WD is a distance along the optical axis between the first light transmitting member and the second surface, NA is the numerical aperture on the second surface side, and the center wavelength of the used light is $L \times 10^{-6}$.

39. An exposure apparatus comprising:

an illumination system that illuminates a mask set as the first surface; and the projection optical system as set forth in claim 25, that forms an image of a pattern formed on the mask, on a photosensitive substrate set as the second surface.

40. An exposure method comprising:

illuminating a mask set as the first surface; and projecting a pattern formed on the mask, onto a photosensitive substrate set as the second surface, by means of the projection optical system as set forth in claim 25.

41. The exposure method according to claim 40, further comprising:

preparing a light transmitting member for replacement to be replaced with the first light transmitting member in the projection optical system; and replacing the first light transmitting member with the light transmitting member for replacement prepared.

42. A method of producing a microdevice, comprising:

preparing a substrate coated with a photosensitive material;

preparing a mask on which a predetermined circuit pattern is formed;

setting the mask as the first surface and illuminating the mask;

projecting the pattern formed on the mask, onto the photosensitive substrate set as the second surface, by means of the projection optical system as set forth in claim 25;

developing the photosensitive material on the substrate; and forming the predetermined circuit pattern on the substrate, using the photosensitive material after the development, as a mask.

43. The method according to claim 42, further comprising:

preparing a light transmitting member for replacement to be replaced with the first light transmitting member in the projection optical system; and replacing the first light transmitting member with the light transmitting member for replacement prepared.

* * * * *

INTER PARTES REEXAMINATION CERTIFICATE (0414th)

United States Patent
Omura

(10) Number: US 7,457,042 C1
(45) Certificate Issued: Jul. 31, 2012

(54) PROJECTION OPTICAL SYSTEM, EXPOSURE APPARATUS, AND EXPOSURE METHOD

(75) Inventor: Yasuhiro Omura, Kumagaya (JP)

(73) Assignee: Nikon Corporation, Chiyoda-Ku, Tokyo (JP)

Reexamination Request:
No. 95/001,678, Jul. 8, 2011

Reexamination Certificate for:
Patent No.: 7,457,042
Issued: Nov. 25, 2008
Appl. No.: 11/224,062
Filed: Sep. 13, 2005

Related U.S. Application Data

(63) Continuation-in-part of application No. PCT/JP2004/003503, filed on Mar. 16, 2004.

(30) Foreign Application Priority Data

Mar. 17, 2003 (JP) .................................... 2003-071495

(51) Int. Cl.
*G02B 9/00* (2006.01)

(52) U.S. Cl. ....................................................... 359/649
(58) Field of Classification Search .................. None
See application file for complete search history.

(56) References Cited

To view the complete listing of prior art documents cited during the proceeding for Reexamination Control Number 95/001,678, please refer to the USPTO's public Patent Application Information Retrieval (PAIR) system under the Display References tab.

*Primary Examiner* — Christina Y Leung

(57) ABSTRACT

A projection optical system which uses, for example, an ArF excimer laser beam and can ensure a good imaging performance for an extended period while avoiding the variations in refractive index and the effect of the intrinsic double refraction of a fluorite containing a high-frequency component. A projection optical system for forming the demagnified image of a first plane (R) on a second plane (W). A first light transmitting member (L23) disposed closest to the second plane side and having almost no refraction power is provided. When the distance between the first light transmitting member and the second plane is WD, a numerical aperture on the second plane side NA, and the center wavelength of a light used $L \times 10^{-6}$, the condition $0.06 < WDNA/L < 0.23$ is satisfied. Or, a first light transmitting member disposed closest to a second plane side and having almost no refraction power, and a second light transmitting member (L22) disposed adjacent to the first plane side are provided. When an air-equivalent length from the second light transmitting member to the second plane is OD, the condition $0.1 < ODNA/L < 0.4$ is satisfied.

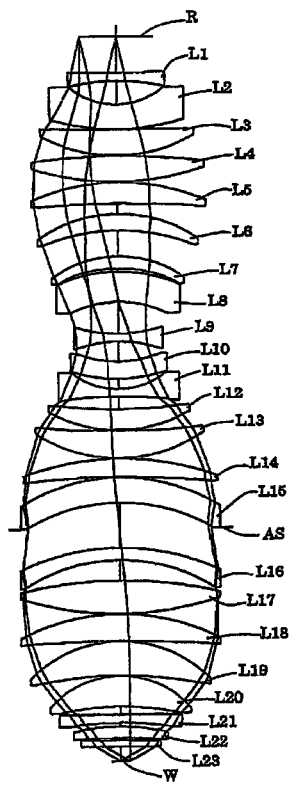

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claims 1-24, 28, 32, 35 and 38 is confirmed.

Claims 25-27, 29-31, 33, 34, 36, 37 and 39-43 are cancelled.

* * * * *